(12) United States Patent
Otremba

(10) Patent No.: US 7,679,197 B2
(45) Date of Patent: Mar. 16, 2010

(54) POWER SEMICONDUCTOR DEVICE AND METHOD FOR PRODUCING IT

(75) Inventor: Ralf Otremba, Kaufbeuren (DE)

(73) Assignee: Infineon Technologies AG, Munich (DE)

( * ) Notice: Subject to any disclaimer, the term of this patent is extended or adjusted under 35 U.S.C. 154(b) by 3 days.

(21) Appl. No.: 11/677,210

(22) Filed: Feb. 21, 2007

(65) Prior Publication Data

US 2007/0200219 A1 Aug. 30, 2007

(30) Foreign Application Priority Data

Feb. 21, 2006 (DE) .................. 10 2006 008 632

(51) Int. Cl.
*H01L 23/48* (2006.01)

(52) U.S. Cl. .............. 257/777; 257/686; 257/692; 257/735; 257/E23.079

(58) Field of Classification Search .......... 257/692, 257/686, E23.079, 777, 735
See application file for complete search history.

(56) References Cited

U.S. PATENT DOCUMENTS

| 5,532,512 | A | | 7/1996 | Fillion et al. .............. 257/686 |
| 5,751,058 | A | * | 5/1998 | Matsuki .................... 257/692 |
| 6,084,310 | A | * | 7/2000 | Mizuno et al. ............. 257/779 |
| 6,465,875 | B2 | * | 10/2002 | Connah et al. ............. 257/666 |
| 6,555,917 | B1 | | 4/2003 | Heo ......................... 257/777 |
| 6,738,258 | B2 | * | 5/2004 | Bijlenga et al. ............ 361/704 |
| 6,740,902 | B2 | * | 5/2004 | Oliver et al. ................ 257/81 |
| 6,774,466 | B1 | * | 8/2004 | Kajiwara et al. ........... 257/673 |
| 6,836,006 | B2 | * | 12/2004 | Muto et al. ................. 257/686 |
| 6,943,434 | B2 | | 9/2005 | Tangpuz et al. ............ 257/666 |
| 2003/0006434 | A1 | * | 1/2003 | Kawafuji et al. ........... 257/203 |
| 2004/0004272 | A1 | * | 1/2004 | Luo et al. .................. 257/666 |
| 2004/0061221 | A1 | * | 4/2004 | Schaffer .................... 257/723 |
| 2004/0130007 | A1 | | 7/2004 | Hsu et al. .................. 257/666 |
| 2006/0017174 | A1 | * | 1/2006 | Otremba .................... 257/778 |

FOREIGN PATENT DOCUMENTS

| DE | 100 03 671 A1 | 8/2000 |
| DE | 103 03 932 A1 | 3/2004 |
| DE | 10 2004 021 054 A1 | 11/2005 |
| DE | 10 2004 030 042 A1 | 1/2006 |

* cited by examiner

*Primary Examiner*—David Vu
*Assistant Examiner*—Brandon Fox
(74) *Attorney, Agent, or Firm*—Banner & Witcoff, Ltd.

(57) ABSTRACT

A power semiconductor device (1; 37) has a leadframe (4), at least one vertical power semiconductor component (2) and at least one further electronic device (3) which is arranged on the power semiconductor component (2). The chip carrier (5) of the leadframe (4) has at least two separate parts (7, 8) on which the power semiconductor component (2) is arranged. The power semiconductor component (2) is embodied such that the lower surface (28) of the first part (7) of the chip carrier (5) provides a ground contact area (36) of the power semiconductor component (2).

23 Claims, 3 Drawing Sheets

POWER SEMICONDUCTOR DEVICE AND METHOD FOR PRODUCING IT

RELATED APPLICATION

This application claims priority from German Patent Application No. DE 10 2006 008 632.5, which was filed on Feb. 21, 2006, and is incorporated herein by reference in its entirety.

TECHNICAL FIELD

The invention relates to a power semiconductor device comprising at least one power semiconductor component and at least one further electronic device, and to a method for producing the power semiconductor device.

BACKGROUND

In the case of semiconductor devices and power semiconductor devices, increased power in increasingly smaller device housings is generally desired. This requirement leads to increasing generation of heat in the housings. If said heat is not distributed sufficiently, the high operating temperature may lead to instability and even to the failure of the device.

In order to improve the heat dissipation, it is possible to incorporate the semiconductor component into a larger housing, in which the heat dissipation is improved by the larger area of the leadframe of the device. However, customers do not desire a larger housing. As an alternative, an additional external heat sink may be mounted on the device. This solution has the disadvantage, however, that the mounting of the device becomes more complicated for the customer and the size of the overall device increases. Moreover, the overall costs are increased by the additional heat sink and also the mounting outlay.

Consequently, there is a need to specify a power semiconductor device which has an improved power and an improved heat dissipation, and which can be mounted onto a printed circuit board in a simple manner, particularly by customers.

SUMMARY

According to an embodiment, a power semiconductor device, may comprise a leadframe comprising a chip carrier and a plurality of leads, the chip carrier comprising at least two separate parts, a vertical power semiconductor component having a first side and a second side, at least one first contact area and at least one control contact area being arranged on the first side, and a second contact area being arranged on the second side, the first contact area being arranged on a first part of the chip carrier and being electrically connected to the first part of the chip carrier, and the control contact area being arranged on a second part of the chip carrier and being electrically connected to the second part of the chip carrier, a plastic housing composition, which embeds at least the power semiconductor component and the upper surface of the chip carrier and leaves free at least a lower surface of the first part of the chip carrier, the plastic housing composition comprising a lower outer surface which together with the lower surface of the first part of the chip carrier forms a common outer surface of the power device, wherein at least one further electronic device is arranged on the second contact area of the vertical power semiconductor component, and the power semiconductor component is embodied such that the lower surface of the first part of the chip carrier provides a ground contact area of the power semiconductor device.

BRIEF DESCRIPTION OF THE DRAWINGS

The invention will now be explained in more detail with reference to the figures.

DETAILED DESCRIPTION

Figure 1:
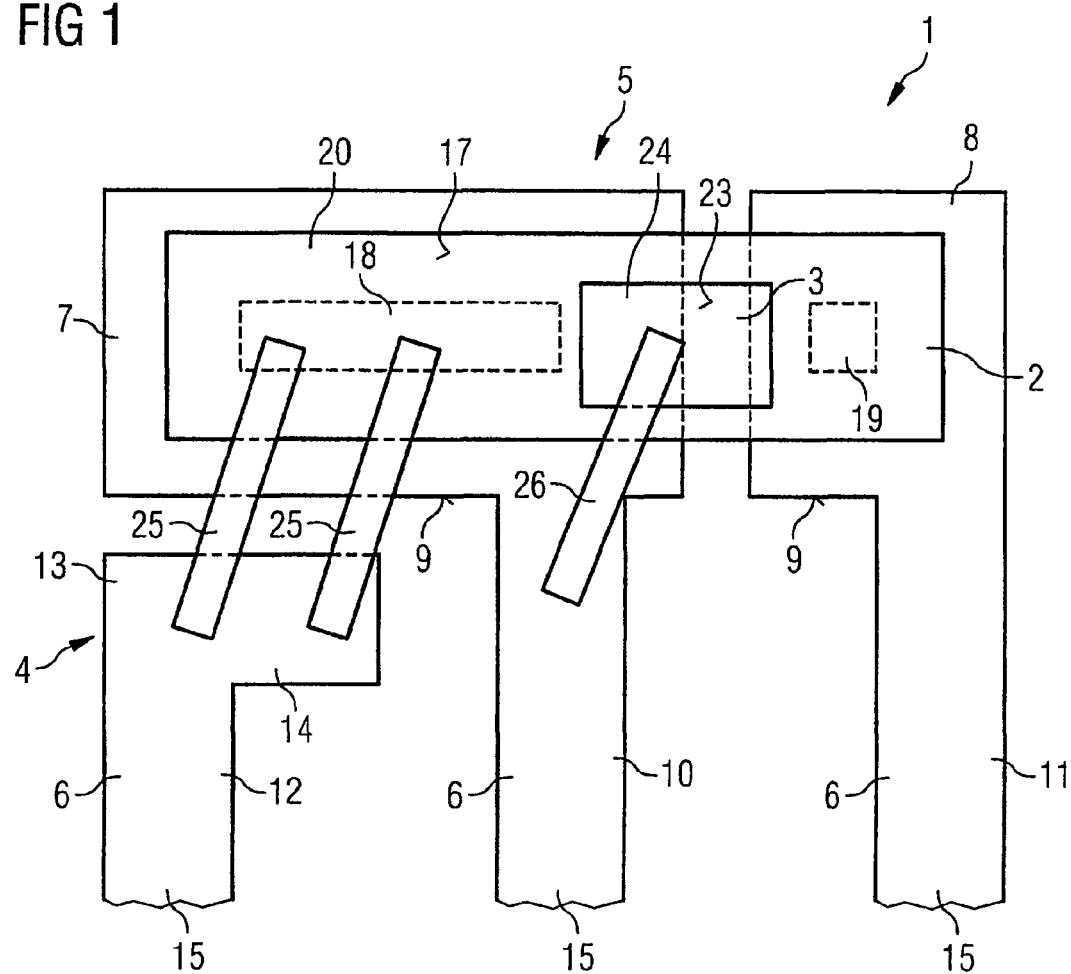
FIG. 1 shows a plan view of a power semiconductor device according to a first embodiment.

According to an embodiment, a power semiconductor device has a leadframe, at least one vertical power semiconductor component, at least one further electronic device and a plastic housing composition.

According to an embodiment, the leadframe has a chip carrier and a plurality of leads. The chip carrier has at least two separate parts. The vertical power semiconductor component has a first side and a second side. At least one first contact area and at least one control contact area are arranged on the first side and a second contact area is arranged on the second side.

According to an embodiment, the first contact area is arranged on the first part of the chip carrier and is electrically connected to the first part of the chip carrier and the control contact area is arranged on the second part of the chip carrier and is electrically connected to the second part of the chip carrier. At least one further electronic device is arranged on the second contact area of the vertical power semiconductor component.

According to an embodiment, the plastic housing composition embeds at least the power semiconductor component and an upper surface of the chip carrier and leaves free at least a lower surface of the first part of the chip carrier. The plastic housing composition has a lower outer surface which together with at least the lower surface of the first part of the chip carrier forms a common outer surface of the power device.

According to an embodiment, the power semiconductor component is embodied such that the lower surface of the first part of the chip carrier provides a ground contact area of the power semiconductor device.

According to an embodiment, the vertical power semiconductor component is mounted on the leadframe, with the result that the first side faces the chip carrier. According to an embodiment, the vertical power semiconductor component is embodied such that after it has been mounted on the chip carrier, the first part of the chip carrier provides the ground contact area of the power semiconductor device. By virtue of this measure, the semiconductor device can be mounted directly over the first part of the chip carrier on a printed circuit board, without the printed circuit board being connected up to high voltages and additional electrical losses being generated. The arrangement according to an embodiment has the consequence that it is possible to avoid an electrical insulation layer between the chip carrier and the printed circuit board or the use of a device housing with a fully encapsulated chip carrier.

As a result, the heat dissipation path of the device is reduced, the thermal resistance of the device is decreased and, consequently, the reliability of the device is improved. Furthermore, the mounting of the device is simplified since the device according to an embodiment can be mounted directly on the printed circuit board without an additional external electrical insulation layer.

The power semiconductor component may be a vertical n-channel power transistor, for example, in which the source electrode and the gate electrode are arranged on one side of the transistor. With this type of transistors, the source electrode is at ground, i.e. 0 V, during normal operation. The transistor can thus be arranged on the chip carrier, with the result that the source electrode is electrically connected to the first part of the chip carrier and the first chip carrier part is the ground contact area of the device.

A vertical power semiconductor device in which the control contact area and a further contact area face the leadframe is known from DE 10 2004 021 054 A1, by way of example. The embodiment of the power semiconductor component on the chip carrier lead, however, to the additional features that the lower surface of the first part of the chip carrier provides the ground contact area of the device. The heat dissipation of the device is improved by this arrangement.

The power semiconductor device according to an embodiment furthermore has at least one further electronic device which is arranged on the second contact area of the vertical power semiconductor component. The second contact area of the power semiconductor component faces the chip carrier. The power semiconductor device according to an embodiment thus has stacked components, the electronic device lying further away from the chip carrier. The properties of vertical power semiconductor components are dependent on the component size and component area. The stacked arrangement according to an embodiment has the advantage that the area of the device housing can be utilized better since the power semiconductor component may have an area which corresponds to the area of the housing or the chip carrier. Consequently, the properties of the vertical power semiconductor device can be increased since the further electronic device does not occupy space on the chip carrier.

The power of the semiconductor device is increased without the size of the device housing being increased. Owing to the arrangement according to an embodiment of the device ground contact area, the thermal properties of the device are simultaneously improved as well.

The vertical power semiconductor component may be a power transistor and may be a MOSFET (Metal Oxide Semiconductor Field Effect Transistor) or an IGBT (Isolated Gate Bipolar Transistor).

In the case of a MOSFET power semiconductor component, the first contact area is a source electrode, the control contact area is a gate electrode and the second contact area is a drain electrode. In the case of an IGBT power semiconductor component, the first contact area is an emitter electrode, the control contact area is a gate electrode and the second contact area is a collector electrode.

In particular, the MOSFET may be an n-channel MOSFET. An n-channel MOSFET has semiconductor material of an n conduction type. The first contact area is at ground, i.e. 0 V, and the second contact area is at a high potential.

The IGBT may be an n-channel IGBT. An n-channel IGBT has semiconductor material of an n conduction type. The first contact area is at ground, i.e. 0 V, and the second contact area is at a high potential.

The further electronic device may be a control semiconductor chip, or a passive device such as, for example, a capacitor, a resistor or an inductor. The power semiconductor device according to an embodiment may therefore have different circuits.

In a further embodiment, the electronic device is a vertical diode having a first side with an anode and a second side with a cathode. The diode may be electrically connected to the second contact area of the vertical power semiconductor component via an electrically conductive layer. The construction of a desired circuit within the device housing is made possible with corresponding further electrical connections. The power semiconductor device may therefore be a module.

In one embodiment, the cathode of the diode is arranged on the second contact area of the second side of the vertical power semiconductor component and is electrically connected to the second contact area via the electrically conductive layer. The diode may be connected in parallel with the power semiconductor component. For this purpose, it is possible to arrange one or a plurality of electrical connections between the anode of the diode and the first contact area of the power semiconductor component. The electrical connections may extend between the anode and the first part of the chip carrier and between the second contact area of the power semiconductor component and a further lead in order to connect the diode in parallel with the power semiconductor component.

In one embodiment, the diode is connected as a freewheeling diode. The power semiconductor device may therefore have a vertical MOSFET or IGBT transistor with a freewheeling diode arranged thereon. The power semiconductor device provides a circuit element which can be constructed together with a plurality of said circuit elements to form a half-bridge or a full bridge in order for example to control a connected motor. On account of the arrangement according to an embodiment of the MOSFET and the ground contact area, the heat dissipation and the reliability of the device are increased even in the case of devices having a plurality of said circuit elements and the mounting of the device on a superordinate printed circuit board or circuit board is simplified.

The electrically conductive layer which connects the diode to the second contact area and also connects the first contact area of the power semiconductor component to the first part of the chip carrier and also connects the control contact area to the second part of the chip carrier may in each case comprise a diffusion solder connection.

The diffusion solder connection may have an Sn-based diffusion solder layer having Au and Sn, Ag and Sn or Cu and Sn, or may have Ag and In. After the production of the diffusion solder connection, the connection has intermetallic phases which are the product of the diffusion solder and the material of the adjacent surface.

A diffusion solder has the advantage that the diffusion solder connection produced has a higher melting point than the temperature at which it was produced. Consequently, the mounting can be carried out at a lower temperature than the melting point of the connection produced. A diffusion solder connection has the further advantage that further diffusion solder methods can then be carried out without the connections that have already been produced melting again. Diffusion solder is therefore suitable for modules and stacked devices which in each case have a plurality of semiconductor components.

An Au and Sn based diffusion solder has a melting point or production temperature of approximately 280° C., an Ag and Sn based diffusion solder of approximately 221° C., and an Ag and In based diffusion solder of approximately 141° C.

Diffusion solders having lower melting points have the advantage that the loading on the semiconductor component is reduced during the soldering method.

The diffusion solder connection may have at least one contact layer and a diffusion solder layer, the contact layer being arranged on the first side of the power semiconductor body. The contact layer may essentially comprise Ti, Ni or Cr and provides a low-resistance contact to the semiconductor body of the semiconductor component. The diffusion solder layer may have an Sn-based diffusion solder.

A further layer for refinement may be arranged directly between the contact layer and the diffusion solder layer and may have one of the elements Ni, Au, Ag, Pt and Pd or an alloy thereof.

In a further embodiment, the diffusion solder layer comprises three layers. A contact layer is arranged directly on the semiconductor body of the semiconductor component, a diffusion barrier layer is arranged directly on the contact layer, and the diffusion solder layer is arranged directly on the diffusion barrier layer.

The contact layer provides a low-resistance contact to the semiconductor body of the semiconductor component. The diffusion barrier layer prevents a reaction between the material of the contact layer and the material of the diffusion solder layer. Such a reaction is disadvantageous since the composition of the two layers changes. This leads to a change in the properties of the layers, for example the contact resistance or the melting point, and to unreliable electrical properties and an unreliable connection.

The contact layer may essentially be composed of aluminum since Al forms a low-resistance contact with silicon. The diffusion barrier layer may essentially be composed of titanium or a first layer composed of titanium and a second layer composed of $TiN_x$. The diffusion solder layer may have an Sn-based diffusion solder.

In a further embodiment, the first contact area has a plurality of contact bumps arranged on the first contact area. The contact bumps are separate from one another and are electrically conductive. The mechanical and electrical connection between the first contact area and the first part of the chip carrier is therefore effected via a multiplicity of separate locations. This arrangement has the advantage that a smaller portion of the heat generated flows in the chip carrier and consequently into the printed circuit board. Adjacent components on the printed circuit board are therefore heated less by said heat and their functionality is not impaired thereby.

In one embodiment, the first part of the chip carrier is thicker than the second part of the chip carrier. The lower surface of the second part of the chip carrier is embedded in the plastic housing composition, while the lower surface of the first part of the chip carrier remains free of the plastic housing composition. In this embodiment, the lower surface of the second chip carrier part is electrically insulated by way of the plastic composition.

In a further embodiment, the first part and the second part of the chip carrier have essentially the same thickness. In this embodiment, the lower surface of the second part of the chip carrier is free of the plastic composition. The lower surface of the second part of the chip carrier together with the lower surface of the first part of the chip carrier and together with the lower outer surface of the plastic housing composition forms a common outer surface of the power semiconductor device. The lower surface of the second part of the chip carrier may therefore provide an outer contact area of the power semiconductor device.

The power semiconductor device according to an embodiment may have a leadframe with various arrangements. In one embodiment, the leads are arranged at a side of the chip carrier. In a further embodiment, a lead extends from the second part of the chip carrier and projects from the plastic housing composition. The control contact area is mounted on the second part of the chip carrier and is electrically connected to said lead. The outer part of the lead therefore provides the control contact terminal of the device. Since the control lead projects from the second part of the chip carrier, further electrical connections between the second chip carrier part and the control contact terminal can be dispensed with in the housing. This simplifies the construction of the device and can shorten the length of the control line.

One or a plurality of leads may also project from the first chip carrier part. This arrangement simplifies the contact-connection of the first contact area of the power semiconductor component. If a diode is arranged on the second contact area of the power semiconductor component and is connected in parallel with the power semiconductor component, the diode can also be contact-connected via said projecting leads.

In one embodiment, the leads in each case have an external contact area which is essentially coplanar with the lower surface of the first part of the chip carrier. The external contact area of the leads may lie in the lower surface of the plastic housing composition. This arrangement provides a surface-mountable device housing. As an alternative, the leads may project from one or from a plurality of side walls of the housing and provide a housing having pins. The housing may therefore have different forms and may have known forms, such as a TO252 or a TO220 housing, by way of example.

The invention also specifies a method for producing the power semiconductor device, having the following steps. The first step involves providing a leadframe, at least one vertical power semiconductor component and also at least one further electronic device.

The leadframe has a chip carrier and a plurality of leads. The chip carrier has at least two separate parts. The vertical power semiconductor component has a first side, on which at least one first contact area and at least one control contact area are arranged, and a second side, on which a second contact area is arranged.

The first contact area of the power semiconductor device is mounted on the first part of the chip carrier with formation of an electrical connection and the control contact area is mounted on the second part of the chip carrier with formation of an electrical connection. At least one further electronic device is then mounted on the second contact area of the vertical power semiconductor component.

At least the power semiconductor component and the upper surface of the chip carrier are embedded in a plastic housing composition, a lower surface of the first part of the chip carrier remaining free of the plastic housing composition. The plastic composition has a lower outer surface which together with the lower surface of the first part of the chip carrier forms a common outer surface of the power device.

The power semiconductor component is embodied such that the lower surface of the first part of the chip carrier provides a ground contact area of the power semiconductor device.

In one form of implementation of the method according to an embodiment, a vertical diode having a first side and a second side is provided as the further electronic device. The first side of the diode has an anode and the second side of the diode has a cathode.

The diode can be electrically connected, during its mounting, to the second contact area of the vertical power semiconductor component via an electrically conductive layer.

In one form of implementation, the cathode of the diode is arranged on the second contact area of the second side of the vertical power semiconductor component and is electrically connected to the second contact area via the electrically conductive layer.

In a further form of implementation, a MOSFET or an IGBT is provided as the power semiconductor component and the diode is connected in parallel with the power semiconductor component. The diode may be connected as a freewheeling diode. For this purpose, further electrical connections between the power semiconductor component and the leadframe and between the diode and the leadframe are produced, which provide the desired circuit. The electrical connections may be bonding wires or thin films.

The diode may be mounted on the second contact area by means of diffusion solder or soft solder.

In a further form of implementation, a plurality of contact bumps are applied on the first contact area of the power semiconductor component. The contact bumps may be applied by means of electrodeposition or sputtering or vapor deposition. A diffusion solder layer may be applied on the outer surface of the contact bumps, with the result that the contact bumps can be mounted on the first part of the chip carrier by means of a diffusion solder method. Prior to the deposition of the diffusion solder layer, a further diffusion barrier layer may also be applied on the contact bumps.

The first contact area of the power semiconductor component may be electrically connected to the first part of the chip carrier and the control contact area of the power semiconductor component may be electrically connected to the second part of the chip carrier, in each case by means of diffusion solder. This method may be carried out by heating the chip carrier to a temperature that is greater than the melting point of the diffusion solder. Afterward, the outer surface of the first contact area is pressed on the first part of the chip carrier, and the control contact area is pressed on the second part of the chip carrier. As a result of the increased temperature and the pressure exerted, intermetallic phases are produced in the diffusion solder layer. Said intermetallic phases have a higher melting point than the melting point of the diffusion solder. Consequently, the mechanical connection and also the electrical connection is produced by the solidification of the boundary between the first contact area or the control contact area, respectively, and the corresponding part of the chip carrier.

In one form of implementation, the first part of the chip carrier is thicker than the second part of the chip carrier. The lower surface of the second part of the chip carrier is embedded in the plastic housing composition.

In a further form of implementation, the lower surface of the second part of the chip carrier remains free of the plastic composition and together with the lower surface of the first part of the chip carrier and the lower outer surface of the plastic housing composition forms a common outer surface of the power semiconductor device.

To summarize, by means of the so-called flip-chip mounting of a vertical transistor, the front side potential of the transistor can be applied to the chip carrier. Since, according to an embodiment, the power semiconductor component is embodied such that the first part of the chip carrier is at ground and provides the ground contact area of the power semiconductor device, a non-insulating power housing or a non-insulating application mounting is made possible without additionally generating electrical losses.

At the same time, the arrangement of a flip-chip power transistor and of a freewheeling diode arranged thereon has the advantage that the maximum chip area of the transistor is no longer dependent on the diode chip area, and may amount to the area of a single chip component.

FIG. 1 shows a plan view of a power semiconductor device 1 comprising a vertical power semiconductor component 2 and a freewheeling diode 3 according to a first embodiment. The power semiconductor component 2 is a vertical power IGBT component of the n conduction type.

The power semiconductor device 1 furthermore has a leadframe 4 having a chip carrier 5 and three leads 6. The leadframe 4 essentially comprises copper. The overall chip carrier 5 is approximately rectangular and comprises two separate parts 7, 8, which are arranged alongside one another in a lateral direction. The first chip carrier part 7 is approximately twice as wide as the second chip carrier part 8 and is mechanically separated from the second chip carrier part 8 by a channel perpendicular to a longitudinal side 9 of the overall chip carrier 5.

The three leads 6 are arranged at one of the longitudinal sides 9 of the overall chip carrier 5. A first lead 10 projects from the first chip carrier part 7, is arranged approximately in the center of the longitudinal side 9 of the overall chip carrier 5 and extends approximately perpendicular to the longitudinal side 9 of the chip carrier 5. A second lead 11 projects from the second chip carrier part 8 and is arranged at a side of the first lead 10, at the right-hand side in the view of FIG. 1. A third lead 12 is arranged at the opposite side of the first lead 10 and is arranged alongside the first chip carrier part 7. The inner end 13 of the third lead 12 is at a distance from the longitudinal side 9 of the chip carrier 5 and is not connected to the chip carrier 5. The inner end 13 extends parallel to the longitudinal side 9 in the direction of the first lead 10. This area 14 therefore provides a contact area 14. The outer regions 15 of the three leads 10, 11, 12 are arranged approximately parallel to one another and in each case provide an external contact terminal of the power semiconductor device 1.

The IGBT component 2 has a first side 16 and an opposite second side 17. The first side 16 has an emitter electrode 18 and a gate electrode 19, which are separated from one another. The IGBT component 2 is laterally rectangular and is arranged on the two parts 7, 8 of the chip carrier 5. The IGBT component 2 extends over the distance or channel between the two parts 7, 8. The emitter electrode 18 is arranged on the first chip carrier part 7 and is electrically connected to the first chip carrier part 7 via a diffusion solder layer (not shown in FIG. 1). The gate electrode 19 is arranged on the second chip carrier part 8 and is electrically connected to the second chip carrier part 7 via a diffusion solder layer (not shown in FIG. 1). The first side 16 of the IGBT component 2 therefore faces the chip carrier 5.

The second side 17 of the IGBT component 7 has a collector electrode 20 and is remote from the chip carrier.

The IGBT component 2 is of the n conduction type and, consequently, the emitter electrode 18 is the ground electrode of the component 2. The collector electrode 20 therefore provides the high-voltage electrode of the component 2. The IGBT component 2 is therefore embodied such that the first chip carrier part 7 and the projecting lead 10 are at ground potential and provide ground contact areas of the power semiconductor device 1.

The diode 3 has a first side 21, on which a cathode 22 is arranged, and an opposite second side 23, on which an anode 24 is arranged. The diode 3 is arranged on the collector electrode 20 and is electrically connected to the collector electrode 20 via an electrically conductive layer 41.

Furthermore, the power semiconductor device 1 has bonding wires which electrically connect the IGBT component 2, the diode 3 and the leads 6 in order to form the circuit of the power semiconductor device 1.

The diode 3 is intended as a freewheeling diode. Consequently, two bonding wires 25 extend between the collector electrode 20 and the contact area 14 of the third lead 12. The bonding wires 25 connect not only the collector electrode 18 to the third lead 12, but also the cathode of the diode 3 to the third lead 12. The third lead 12 is therefore the collector and cathode terminal of the power semiconductor device 1.

A further bonding wire 26 extends between the anode 24 of the diode 3 and the first lead 10. The first lead 10 is therefore the emitter and anode terminal of the power semiconductor device 1. The bonding wires 25, 26 have aluminum. The arrangement of the diode, the IGBT component 2 and the bonding wires 25, 26 provides a circuit in which the diode 3 is connected in parallel with the IGBT component 2.

The power semiconductor device 1 also has a plastic housing composition, which is not shown in the plan view of FIG. 1.

Figure 2:
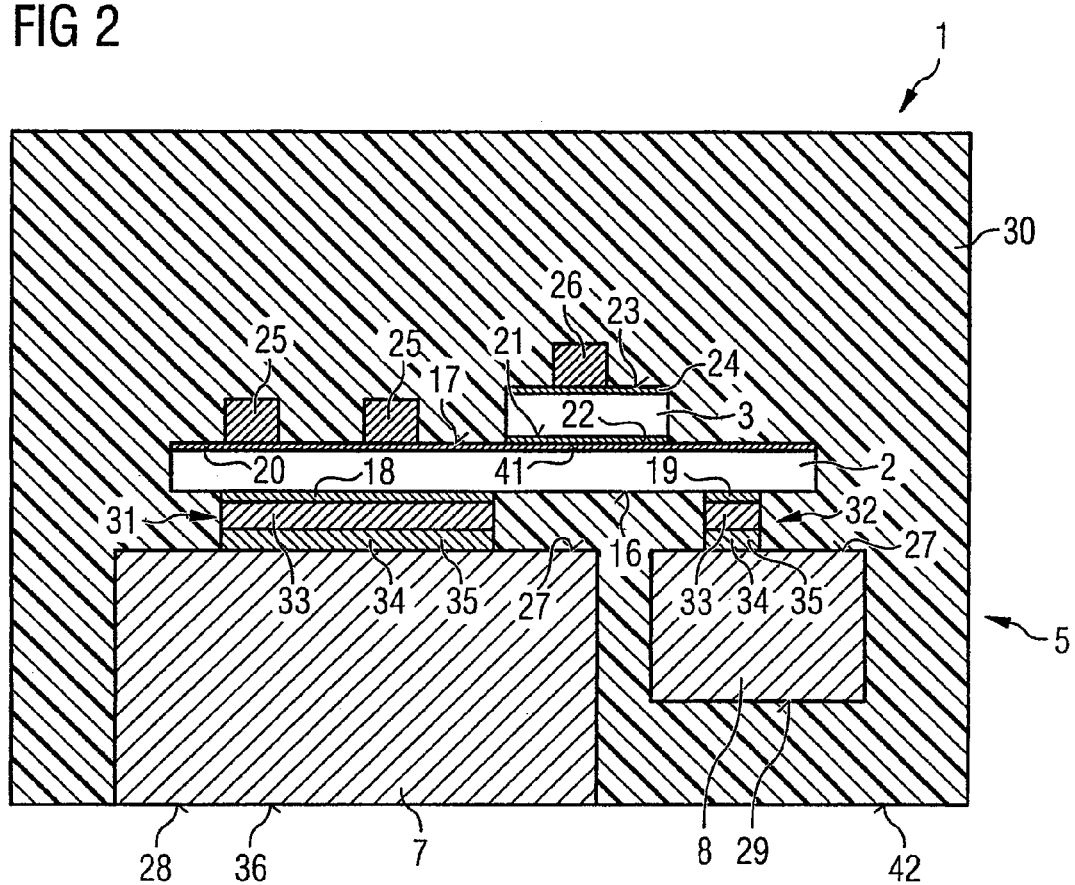
FIG. 2 shows a cross section through the power semiconductor device from FIG. 1.

FIG. 2 shows a cross section through the power semiconductor device 1 from FIG. 1, in which the arrangement of the two parts 7, 8 of the chip carrier 5 and also the stack of the IGBT component 2 and of the diode 3 can be seen.

The cross section of FIG. 2 reveals that the two chip carrier parts 7, 8 have different thicknesses. The first chip carrier part 7 is thicker than the second chip carrier part 8. The upper surface 27 of the first part 7 and of the second part 8, on which the emitter electrode 18 and the gate electrode 19, respectively, are arranged, lie in approximately the same plane. The lower surface 28 of the first chip carrier part 7 therefore lies at a different plane in relation to the lower surface 29 of the second chip carrier part 8.

The plastic housing composition 30 forming the housing of the power semiconductor device 1 can also be seen in FIG. 2. The IGBT component 2, the diode 3, the bonding wires 25, 26 and also the inner regions of the leads 6 are completely embedded in the plastic housing composition 30. The second chip carrier part 8 including its lower surface 29 is also embedded in the plastic housing composition 30. In contrast thereto, the lower surface 28 of the first chip carrier part 7 is not covered by the plastic housing composition 30, and together with the underside (42) of the plastic housing composition 30 forms a common outer surface of the power semiconductor device 1. The lower surface 29 of the first chip carrier part 7 therefore provides the ground contact area 36 of the power semiconductor device 1 since it is accessible from outside the power semiconductor device 1.

The arrangement of the diffusion solder connections 31, 32 which electrically connect the emitter electrode 18 to the upper surface 27 of the first chip carrier part 7 and, respectively, the gate electrode 19 to the upper surface of the second chip carrier part 8 can also be seen in FIG. 2. The arrangement of the two diffusion solder connections 31, 32 is essentially identical.

The diffusion solder connections 31, 32 in each case have two layers arranged on the emitter electrode 18 and the gate electrode 19. The emitter electrode 18 and the gate electrode 19 are essentially composed of aluminum. The aluminum forms a contact layer on the silicon of the semiconductor body of the IGBT component 2, since aluminum forms a low-resistance electrical contact with silicon. A diffusion barrier layer 33 composed of titanium is arranged directly on the aluminum of the emitter electrode 18 and of the gate electrode 19. A diffusion solder layer 34 is arranged directly between the diffusion barrier layer 33 and the upper surface 27 of the chip carrier 5. The diffusion solder layer 34 has intermetallic phases 35 which are the product of a reaction between a diffusion solder and the material of the chip carrier 5.

The IGBT component 2 is produced with an emitter electrode 18 and a gate electrode 19, which in each case have an aluminum layer 18, 19, a diffusion barrier layer 33 and a diffusion solder layer 34. The deposited diffusion solder layer has diffusion solder. This may also be carried out at the wafer levels and the components may then be separated from the wafer.

In order to mount the IGBT component 2 on the chip carrier 5, at least the chip carrier 5 of the leadframe 4 is heated to a temperature lying above the melting point of the diffusion solder. The IGBT component 2 is applied on the chip carrier 5, with the result that the emitter electrode 18 is arranged on the first chip carrier part 7 and the gate electrode 19 is arranged on the second chip carrier part 8. As a result of the production of intermetallic phases from a reaction of the outer diffusion solder layer 34 and the surface 27 of the chip carrier 5, the diffusion solder layer 34 will solidify and the IGBT component 2 is mounted on the chip carrier 5.

After the mounting of the first side 16 of the IGBT component 2 on the upper surface 27 of the chip carrier 5, the diode 3 is mounted on the collector electrode 20 arranged on the upper side of the IGBT component 2. This is realized by means of a diffusion solder or soft solder. Afterward, the bonding wires 25 between the emitter electrode 20 and the third lead 12 and a bonding wire 26 between the anode 24 and the first lead 10 are produced in order to provide the rewiring of the power semiconductor device 1.

Finally, the IGBT component 2, the diode 3, the bonding wires 25, 26, the inner regions of the leads 6, the second chip carrier part 8 and at least the upper region of the first chip carrier part 7 are embedded in a plastic housing composition. The lower surface 28 of the first chip carrier part 7 remains free of the plastic housing composition 30 and provides a ground contact area 36 of the power semiconductor device 1.

The distance between the upper surface 27 of the chip carrier 5 and the lower first surface 16 of the IGBT component 2 can be increased in order to increase the electrical insulation of the IGBT component 2 from the chip carrier 5. This may be realized by a reinforcement of the emitter electrode 18 and of the gate electrode 19 or of the diffusion solder connection 31, 32. For this purpose, prior to its mounting on the chip carrier 5, a thicker structured metallization may be deposited on the first side 16 of the IGBT component 2.

Figure 3:
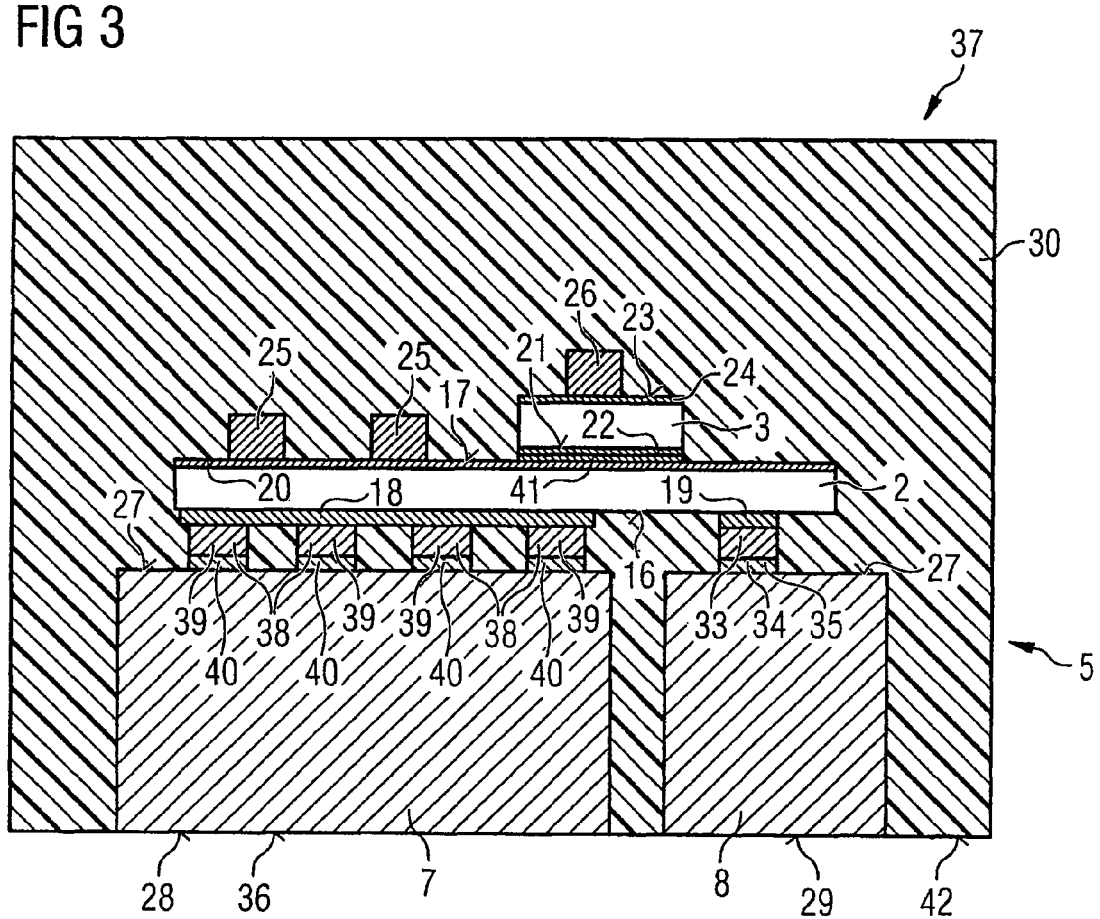
FIG. 3 shows a cross section through a power semiconductor device according to a second embodiment.

FIG. 3 shows a power semiconductor device 37 according to a second embodiment. The power semiconductor device 37 differs from the power semiconductor device 1 by virtue of the structure of the emitter electrode 18 and its connection to the first chip carrier part 7 and by virtue of the structure of the chip carrier 5.

In the case of the power semiconductor device 37 according to the second embodiment, the second chip carrier part 8 has essentially the same thickness as the first chip carrier part 7. The lower surface 28 of the first chip carrier part 7 and the lower surface 29 of the second chip carrier part 8 are therefore essentially coplanar. The lower surface 29 of the second chip carrier part 8 remains free of the plastic housing composition 30 and forms a common surface with the lower surface of the first chip carrier part 7 and the lower outer surface 42 of the plastic housing composition 30. The lower surface 29 of the second chip carrier part 8 can therefore provide an external contact area of the power semiconductor device 37.

In the second embodiment, the emitter electrode 18 has a plurality of electrically conductive contact bumps 38 provided in the form of elevations on the surface of the emitter electrode 18. The contact bumps 38 are physically separate from one another and arranged in a matrix of rows and columns (not shown). The contact bumps 38 comprise two layers 39, 40. The first layer 39 is arranged on the emitter electrode 18 and forms the base elevation of the respective contact bumps 38. The second layer 40 is arranged on the first layer 39 and is a diffusion solder layer having intermetallic phases which are the product of a diffusion solder method, as already described above. The second layer 40 is therefore arranged directly between the surface 27 of the first chip carrier part 7 and the first layer 39 of the contact bumps 38. The emitter electrode 18 is mounted above the contact bumps 38 on the first chip carrier part 7 and electrically connected thereto. The interface between the emitter electrode 18 and the first chip carrier part 7 is reduced by the contact bumps 38. This reduces the portion of heat which flows in the chip carrier and into the printed circuit board on which the power semiconductor device 37 is mounted. As a result of this measure, the temperature of the printed circuit board and in particular of adjacent components can be reduced and the reliability of said components and also the overall circuit can be improved.

The thickness of the gate electrode 19 corresponds to the total thickness of the emitter electrode 18 and the contact bumps 38, with the result that the first side 16 of the IGBT component 2 lies approximately parallel to the upper surface 27 of the chip carrier. The gate electrode 19 also has two layers, which essentially correspond to the layers 39 and 40 of the contact bumps 38. This arrangement of the gate electrode 19 simplifies the production method since both structures can be produced simultaneously.

The contact bumps 38 are produced by selective deposition of the desired layer sequence on the emitter electrode 18. At the same time, the layers are deposited on the gate electrode 19. The IGBT component 2 with contact bumps 38 is mounted on the chip carrier 5 by means of a diffusion solder method, as already described above.

In further embodiments (not shown) the vertical power semiconductor component is a vertical MOSFET component. The power semiconductor device may therefore also have a MOSFET with a freewheeling diode.

In further embodiments which are not shown in the figures, the power semiconductor device has a plurality of stacks which, in one embodiment, in each case have a vertical transistor and a freewheeling diode stacked thereon. The power semiconductor device may therefore provide half-bridge and full bridge.

List of Reference Symbols

1 First power semiconductor device
2 Power semiconductor component
3 Diode
4 Leadframe
5 Chip carrier
6 Lead
7 First chip carrier part
8 Second chip carrier part
9 Longitudinal side of the chip carrier
10 First lead
11 Second lead
12 Third lead
13 Inner end of the third lead
14 Contact area of the third lead
15 External contact terminals
16 First side of the semiconductor component
17 Second side of the semiconductor component
18 Emitter electrode
19 Gate electrode
20 Collector electrode
21 First side of the diode
22 Cathode
23 Second side of the diode
24 Anode
25 Bonding wire
26 Bonding wire
27 Upper surface of the chip carrier
28 Lower surface of the first chip carrier part
29 Lower surface of the second chip carrier part
30 Plastic housing composition
31 Diffusion solder connection
32 Diffusion solder connection
33 Diffusion barrier layer
34 Diffusion solder layer
35 Intermetallic phases
36 Ground contact area
37 Second power semiconductor device
38 Contact bump
39 First layer of the contact bump
40 Second layer of the contact bump
41 Electrically conductive layer
42 Lower surface of the plastic housing composition

What is claimed is:

1. A power semiconductor device, comprising:
   a leadframe comprising a chip carrier and a plurality of leads comprising a first lead and a second lead, the chip carrier comprising at least two separate parts,
   a vertical power semiconductor component having a first side and a second side, at least one first contact area and at least one control contact area being arranged on the first side, and a second contact area being arranged on the second side,
   the first contact area being arranged on a first part of the chip carrier and being electrically connected to the first part of the chip carrier, and the control contact area being arranged on a second part of the chip carrier and being electrically connected to the second part of the chip carrier,
   a plastic housing composition, which embeds at least the power semiconductor component and the upper surface of the chip carrier and leaves free at least a lower surface of the first part of the chip carrier, the plastic housing composition comprising a lower outer surface which together with the lower surface of the first part of the chip carrier forms a common outer surface of the power device,
   wherein at least one further electronic device is arranged on the second contact area of the vertical power semiconductor component, and the lower surface of the first part of the chip carrier provides a ground contact area of the power semiconductor device, and
   wherein the first lead projects from the first part of the chip carrier and the second lead projects from the second part of the chip carrier.

2. The power semiconductor device as claimed in claim 1, wherein the electronic device is a control semiconductor chip or a capacitor or a resistor or an inductor.

3. The power semiconductor device as claimed in claim 1, wherein the electronic device is a vertical diode having a first side and a second side, the first side comprising a cathode and the second side having an anode.

4. The power semiconductor device as claimed in claim 3, wherein the diode is electrically connected to the second contact area of the vertical power semiconductor component via an electrically conductive layer.

5. The power semiconductor device as claimed in claim 3, wherein the cathode of the diode is arranged on the second contact area of the second side of the vertical power semiconductor component and is electrically connected to the second contact area via the electrically conductive layer.

6. The power semiconductor device as claimed in claim 3, wherein the diode is connected in parallel with the power semiconductor component.

7. The power semiconductor device as claimed in claim 6, wherein the diode is connected as a freewheeling diode.

8. The power semiconductor device as claimed in claim 4, wherein the electrically conductive layer comprises a diffusion solder connection.

9. The power semiconductor device as claimed in claim 1, wherein the first contact area comprises a plurality of contact bumps arranged on the first contact area.

10. The power semiconductor device as claimed in claim 1, wherein the first contact area of the power semiconductor component is electrically connected to the first part of the chip carrier and the control contact area of the power semiconductor component is electrically connected to the second part of the chip carrier, in each case via a diffusion solder connection.

11. The power semiconductor device as claimed in claim 10, wherein the diffusion solder connection comprises at least one contact layer and a diffusion solder layer, the contact layer being arranged on the first side of the power semiconductor component.

12. The power semiconductor device as claimed in claim 1, wherein the power semiconductor component is a MOSFET or an IGBT.

13. The power semiconductor device as claimed in claim 1, wherein the first part of the chip carrier is thicker than the second part of the chip carrier, the lower surface of the second part of the chip carrier being embedded in the plastic housing composition.

14. The power semiconductor device as claimed in claim 1, wherein the lower surface of the second part of the chip carrier is free of the plastic composition and together with the lower surface of the first part of the chip carrier and the lower outer surface of the plastic housing composition forms a common outer surface of the power semiconductor device.

15. The power semiconductor device as claimed in claim 1, wherein the leads are arranged at a side of the chip carrier.

16. The power semiconductor device as claimed in claim 1, wherein the second lead further projects from the plastic housing composition.

17. The power semiconductor device as claimed in claim 1, wherein the leads in each case comprise an external contact area which is essentially coplanar with the lower surface of the first part of the chip carrier.

18. The power semiconductor device as claimed in claim 1, wherein the power semiconductor device has a TO252 or a TO220 housing.

19. The power semiconductor device of claim 1, wherein the at least one further electronic device is arranged directly on the second contact area.

20. The power semiconductor device of claim 1, wherein:
the electronic device is electrically connected to the second contact area of the vertical power semiconductor component via an electrically conductive layer,
the electronic device is connected in parallel with the power semiconductor component, and
the power semiconductor component is a MOSFET or an IGBT.

21. A power semiconductor device, comprising:
a leadframe comprising a chip carrier, a first lead, and a second lead, wherein the chip carrier comprises a first part and a second part separate from the first part, the first lead projects from the first part of the chip carrier, and the second lead projects from the second part of the chip carrier;
a ground contact area of the power semiconductor device disposed on a surface of the first part of the chip carrier;
a vertical power semiconductor component having a first side and a second side, at least one first contact area and at least one control contact area disposed on the first side, and a second contact area disposed on the second side, wherein the first contact area is disposed on and electrically connected to the first part of the chip carrier, and the control contact area is disposed on and electrically connected to the second part of the chip carrier;
an electronic device is disposed on the second contact area of the vertical power semiconductor component; and
a housing, wherein the power semiconductor component, a portion of the first part of the chip carrier, and a portion of the second part of the chip carrier are embedded in the housing, and said surface of the first part of the chip carrier and a surface of the second part of the chip carrier are each exposed to a region outside the housing.

22. The power semiconductor device of claim 21, wherein the electronic device is disposed directly on the second contact area.

23. A power semiconductor device, comprising:
a leadframe comprising a chip carrier and a plurality of leads comprising a first lead and a second lead, the chip carrier comprising at least two separate parts;
a vertical power semiconductor component having a first side and a second side, at least one first contact area and at least one control contact area being arranged on the first side, and a second contact area being arranged on the second side, the vertical power semiconductor component being either a MOSFET or an IGBT, wherein the first contact area is arranged on a first part of the chip carrier and being electrically connected to the first part of the chip carrier, and the control contact area being arranged on a second part of the chip carrier and being electrically connected to the second part of the chip carrier; and
a plastic housing composition, which embeds at least the power semiconductor component and the upper surface of the chip carrier and leaves free at least a lower surface of the first part of the chip carrier, the plastic housing composition comprising a lower outer surface which together with the lower surface of the first part of the chip carrier forms a common outer surface of the power device,
wherein a freewheeling vertical diode is electrically connected in parallel with the power semiconductor component, and electrically connected to the second contact area of the vertical power semiconductor component via an electrically conductive layer, and wherein the lower surface of the first part of the chip carrier provides a ground contact area of the power semiconductor device, and
wherein the first lead projects from the first part of the chip carrier and the second lead projects from the second part of the chip carrier.

* * * * *